(12) United States Patent
Elian et al.

(10) Patent No.: US 7,928,011 B2
(45) Date of Patent: Apr. 19, 2011

(54) METHOD FOR STRUCTURING A SUBSTRATE USING A METAL MASK LAYER FORMED USING A GALVANIZATION PROCESS

(75) Inventors: Klaus Elian, Alteglöfsheim (DE); Michael Sebald, Weisendorf (DE)

(73) Assignee: Qimonda AG, München (DE)

( * ) Notice: Subject to any disclaimer, the term of this patent is extended or adjusted under 35 U.S.C. 154(b) by 567 days.

(21) Appl. No.: 11/969,747

(22) Filed: Jan. 4, 2008

(65) Prior Publication Data
US 2009/0174077 A1    Jul. 9, 2009

(51) Int. Cl.
*H01L 21/44* (2006.01)

(52) U.S. Cl. ........ 438/687; 438/408; 438/441; 257/762; 257/E21.01

(58) Field of Classification Search .................. 438/687, 438/408, 441; 257/762, E21.01
See application file for complete search history.

(56) References Cited

U.S. PATENT DOCUMENTS

| | | | | |
|---|---|---|---|---|
| 2002/0084193 | A1* | 7/2002 | Merricks et al. | 205/205 |
| 2004/0238927 | A1* | 12/2004 | Miyazawa | 257/678 |
| 2006/0084264 | A1* | 4/2006 | Baskaran et al. | 438/652 |
| 2006/0094226 | A1* | 5/2006 | Huang et al. | 438/613 |
| 2006/0292846 | A1* | 12/2006 | Pinto et al. | 438/597 |
| 2008/0160762 | A1* | 7/2008 | Feustel et al. | 438/680 |

OTHER PUBLICATIONS

"International Technology Roadmap for Semiconductors: Lithography," http://www.itrs.net/, ITRS 2005 Edition, 29 pages, ITRS.

* cited by examiner

*Primary Examiner* — Thao X Le
*Assistant Examiner* — Matthew Gordon
(74) *Attorney, Agent, or Firm* — Cohen Pontani Lieberman & Pavane LLP

(57) ABSTRACT

A method and intermediate product for structuring a substrate is disclosed. At least one seed layer including a first metal compound is positioned at least partially on the substrate. The seed layer is subjected to a solution comprising ions of a second metal compound. The ions are reduced in the solution by reduction means so that the second metal compound is deposited as mask layer on the seed layer.

22 Claims, 2 Drawing Sheets

METHOD FOR STRUCTURING A SUBSTRATE USING A METAL MASK LAYER FORMED USING A GALVANIZATION PROCESS

BACKGROUND

In the processing of substrates which are used in the manufacturing of semiconductor devices, resist masks are used to define structures in substrates.

The size of structures in the resist mask is in many cases one of several limiting factors for the size of the structures to be manufactured in the substrate. Following the trend in the technology, it is often the aim to produce very small structures in the substrate.

BRIEF DESCRIPTION OF THE DRAWINGS

In the following, several embodiments of a method for structuring a substrate are described. The figures describe the embodiments that are just examples.

DETAILED DESCRIPTION OF ILLUSTRATIVE EMBODIMENTS

Figure 1:
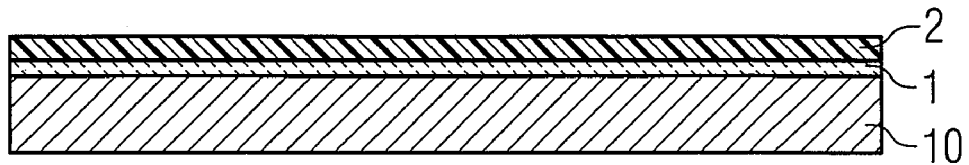
FIG. 1 shows a cross section through a layered stack as a starting point for an embodiment of the method.

FIG. 1 shows schematically a cross section through a layered stack of a substrate 10 with a seed layer 1 and a resist layer 2 which is situated above the seed layer 1. The purpose of the seed layer 1 and the resist layer 2 will be more fully explained below.

The substrate 10 can comprise, e.g., a silicon wafer, a germanium wafer or a III-V material wafer as they are used in the manufacturing of semiconductor devices. Examples of semiconductor devices are microprocessors, memory chips such as DRAM-chips or Flash-chips, biochips, microelectromechanical devices, masks or optoelectronic devices.

In the context of the embodiments, it is understood that the substrate 10 does not necessarily have to be a homogeneous material but can comprise other layers (e.g., oxide layers, doped parts layers) and/or structures manufactured on or in the substrate 10 in previous process steps. In FIG. 1 for the reasons of simplicity the substrate 10 is shown as a non-structured wafer.

The seed layer 1, applied by, e.g., spin coating, comprises a first metal, e.g., in the form of a metal-organic compound. The thickness of the seed layer 1 is rather thin as a thickness of 1 nm is sufficient, but the thickness could also be in the range of about 1 to about 30 nm, or about 5 to about 10 nm in particular. A purpose of the seed layer 1 is to provide nucleation points in the form of first metal atoms which will be used in later processing steps. The nucleation points are provided by, e.g., a metal-organic substance. In one embodiment, the metal-organic substance comprises at least one aliphatic group or at least one aromatic group or a combination of both.

In another embodiment, such metal-organic compounds comprise copper, tungsten or titanium. Examples for copper compounds are copper(II)phtalocyanin, copper(II)gluconate and copper(II)-4-cyclohexyl-butyrate. The metal compound of the seed layer 1 provides on the surface distributed nanoparticles as nucleation points.

Further embodiments comprise a seed layer 1 with a support polymer such as novolac, a cross-linker and/or a solvent (e.g., an organic solvent).

A resist layer 2 is positioned on top of the seed layer 1. This can, e.g., be a photoresist as it is known in the art, such as a positive CAR resist, an ArF resist or an ArF immersion resist. The resist layer 2 is applied with a spin coating technique so that the thickness of the resist layer 2 is, e.g., between 20 and 60 nm.

Optionally, not shown in FIG. 1, an anti-reflecting layer can be positioned on top of the resist layer 2.

The layered stack, as shown in the example of FIG. 1, is then subjected to a processing step in which the resist layer 2 is patterned by a method such as, e.g., lithography (e.g., with i-line, 248 nm, 193 nm, DUV, EUV), e-Beam irradiation, immersion lithography, IPL or nanoimprint techniques. Such methods can comprise, e.g., an illumination step, a post exposure bake step, a developing step with, e.g., TMAH.

Figure 2:
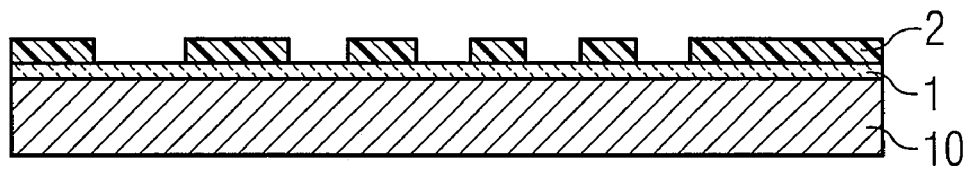
FIG. 2 shows the layered stack of FIG. 1 after a first processing step.

In FIG. 2 the result of the structuring is shown schematically. Since the resist layer 2 is relatively thin, the illumination step can work with a sharp focus resulting in a high resolution.

The layered stack shown in FIG. 2 is subsequently subjected to a further process step, i.e., the application of a solution 4 (FIG. 3) comprising ions of a second metal compound, the ions being reduced in the solution 4 by reduction means so that the second metal compound is deposited as a mask layer on the seed layer.

The solution 4 can in one embodiment comprise water as a solvent. In other embodiments the solution can comprise a mixture of water and a tenside, an organic solvent, a mixture of water with an organic solvent or aceteonitrile.

The reduction means can be an acid such as, e.g., ascorbinic acid or citric acid.

In the solution 4 the second metal ions can, e.g., be present as an oxidized form of a salt. In one embodiment the salt comprises a salt soluble in water or a salt soluble in a mixture of water and a tenside or a salt soluble in a mixture of water and an organic solvent. Non-limiting examples for second metal compounds are copper(I)thiocyanate, copper(II)sulfate and/or copper(II)chloride.

In a further embodiment the second metal is identical to the first metal in the seed layer 1. Examples of such materials are listed above.

The solution 4 is applied to the surface of the structured substrate 10, i.e., covering the structured portions of the resist layer 2 and the open portions of the seed layer 1. The metal atoms in the seed layer 1 are reduced which then form the nucleation points for further selective deposition of the second metal from the solution 4. This deposition using a galvanizing process can be very homogenous resulting in a thin mask layer 5 in the surface portions not covered by the resist layer 2. The thin mask layer 5 comprising nonvolatile metaloxides such as copper oxides, is stable against etching. Since the mask layer 5 is thin, the further processing of the substrate is enhanced.

The seed layer 1 is a means for providing nucleation points for the deposition of further metal.

In another embodiment the method further comprises a solution 4 with additives for homogenization of the metal deposition and/or a buffer. Non-limiting examples for additives for homogenization are glucose and/or starch.

Figure 3:
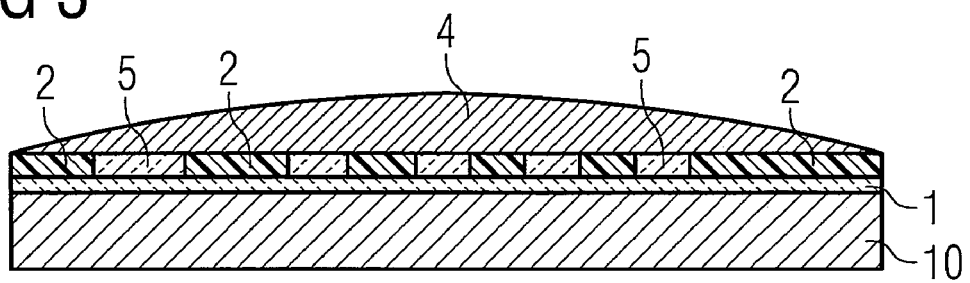
FIG. 3 shows the layered stack of FIG. 2 after a second processing step involving the application of a solution.
Figure 3A:
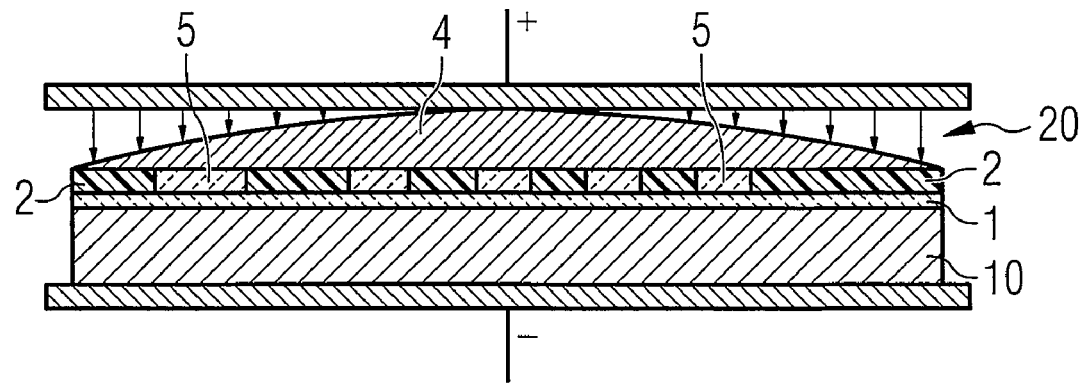
FIG. 3A shows a variant of the process step shown in FIG. 3 involving an external electrical field.

In FIG. 3 a galvanizing process without an external electrical field is shown. In a variant of this embodiment, the substrate 10, the seed layer 1 and the solution 4 are subjected to an external electrical field 20 which is shown in FIG. 3A.

Figure 4:
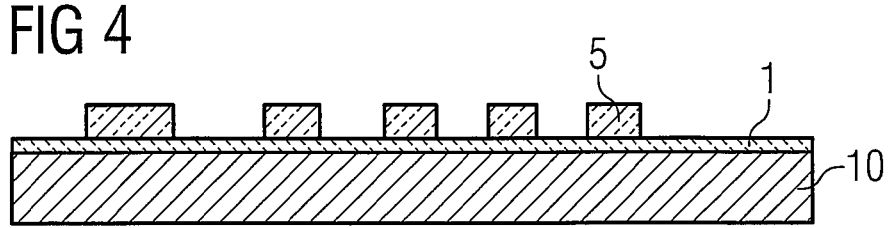
FIG. 4 shows the removal of resist from the layered stack depicted in FIG. 3 as a further process step.

In the following Figures optional process steps in the further processing of the layered stack are shown. In FIG. 4 the situation after the removal of the resist layer 2 is depicted. The resist layer 2 might be removed by methods known in the art. This can be a separate stripping process or the removal can be performed together with a further etching step (see FIG. 5), e.g., by an oxygen plasma. The mask layer 5 is above the substrate 10, in the position for further structuring.

Figure 5:
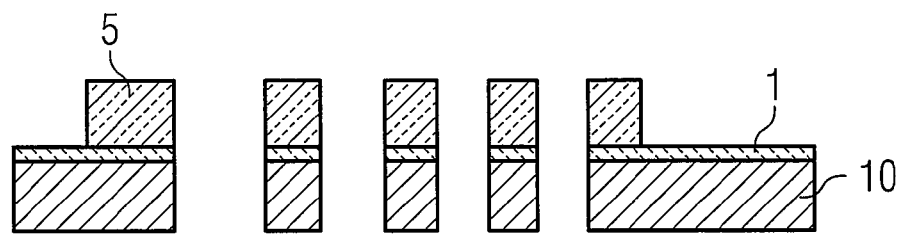
FIG. 5 shows the structuring of the substrate in the layered stack according to FIG. 4 as a further process step.

In FIG. 5 the layered stack of FIG. 4 shown after the mask layer 5 has been removed, e.g., by an etch medium comprising nitric acid or aqueous hydrofluoric acid, in parts, thereby structuring the substrate 10. Alternatively the mask layer can be removed by a plasma based process, e.g., comprising $CF_4$.

Figure 6:
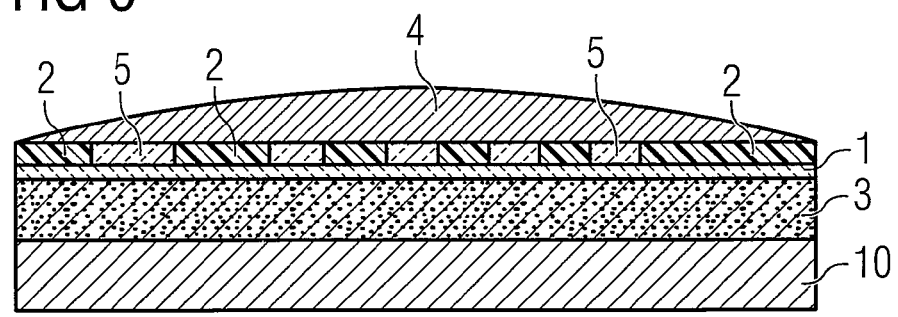
FIG. 6 shows a variation of a layered stack analog to FIG. 3.

In FIG. 6 a cross section of a further embodiment of the method is shown. In addition to the layered stack shown in FIG. 1, the stack in FIG. 6 has an additional carbon layer 3 which can later be used as a hard mask to structure the substrate 10. Otherwise the layered stack is analogous to the one shown in FIGS. 1 and 2. In FIG. 6 the solution 4 comprising the second metal has been applied. The processes which result in the formation of the mask layer 5 have been described above.

Figure 7:
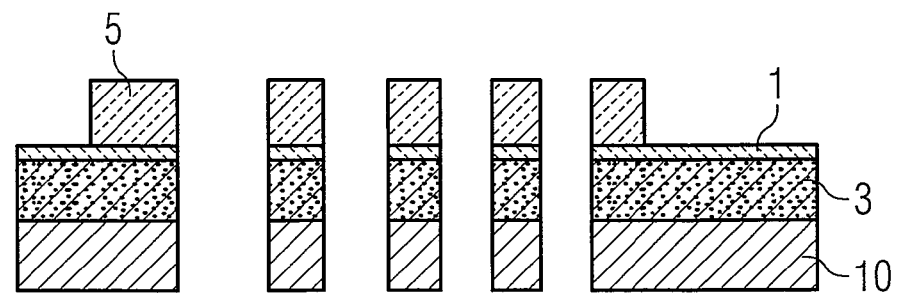
FIG. 7 shows a further processing of the layered stack in FIG. 6.

After the removal of the solution 4 and the resist layer 2, the carbon layer 3 and the substrate 10 can be structured with methods known in the art. This is shown in FIG. 7. The variation of the method shown in FIGS. 6 and 7 uses an electric current free processing. It is also possible to apply an external electrical field (see, e.g., FIG. 3A) to this embodiment.

FIG. 3 also shows an embodiment of an intermediate product comprising one seed layer 1 with a first metal compound. The seed layer 1 is in contact with a solution with ions of a second metal compound. Ions in the solution are being reduced by reduction means, so that the second metal compound is deposited as a mask layer. For details regarding the chemical composition, reference is made to the description of the method.

The embodiments have been described in the context of several examples. The person skilled in the art will recognize that process steps and materials might be changed and adapted.

What is claimed is:

1. A method for structuring a substrate, the method comprising:
   forming at least one seed layer comprising a first metal compound at least partially on the substrate;
   subjecting the seed layer to a solution comprising ions of a second metal compound, the ions being reduced in the solution using an acid in a galvanization process without an external electrical field so that the second metal compound is deposited as a mask layer on the seed layer; and
   after subjecting the seed layer to a solution etching the substrate using the mask layer as an etch mask thereby structuring the substrate.

2. The method according to claim 1, wherein the first metal compound and the second metal compound are identical.

3. The method according to claim 1, wherein the seed layer comprises a metal-organic compound.

4. The method according to claim 3, wherein the metal-organic compound comprises a compound in an aliphatic group or an aromatic group.

5. The method according to claim 3, wherein the metal-organic compound comprises at least one compound selected from the group consisting of a compound comprising copper, a compound comprising titanium, a compound comprising tungsten, copper(II)phtalocyanin, copper(II)gluconate and copper(II)-4-cyclohexyl-butyrate.

6. The method according to claim 1, wherein the seed layer further comprises a support polymer, a linker and/or a solvent.

7. The method according to claim 1, wherein the seed layer has a thickness between about 1 nm and about 30 nm.

8. The method according to claim 7, wherein the seed layer has a thickness between about 5 and about 10 nm.

9. The method according to claim 1, wherein the second metal compound ions are present in the solution as an oxidized form in a salt.

10. The method according to claim 9, wherein the solution comprises at least a salt from the group consisting of salts soluble in water, salts soluble in a mixture of water and a tenside, and salts soluble in a mixture of water and an organic solvent.

11. The method according to claim 9, wherein the solution comprises copper (I)thiocyanate, copper(II)sulfate and/or copper(II)chloride.

12. The method according to claim 1, wherein the solution further comprises additives for homogenization of the metal deposition and/or a buffer.

13. The method according to claim 1, wherein the reduction agent comprises ascorbinic acid and/or citric acid.

14. The method according to claim 1, wherein the solution further comprises as a solvent at least one of water, a mixture of water with an tenside, an organic solvent, a mixture of water with an organic solvent and acetonitrile.

15. The method according to claim 1, wherein the solution provides a redox reactive compound for a currentless galvanization of the seed layer.

16. The method according to claim 1, further comprising structuring the seed layer with a resist mask above the seed layer.

17. The method according to claim 16, wherein the resist mask has a thickness between about 1 nm and about 50 nm.

18. The method according to claim 1, wherein the substrate comprises a hard mask.

19. The method according to claim 1, further comprising removing remains of a metal comprising layer by an oxidizing process step.

20. The method according to claim 1, wherein the substrate is part of a semiconductor device.

21. The method according to claim 20, wherein the semiconductor device comprises a microprocessor, a DRAM-chip, a Flash-chip, a biochip, a mask, a microelectro-mechanical device or an opto-electronic device.

22. A method for structuring a substrate, the method comprising:
   forming a seed layer comprising a nucleation compound at least partially on the substrate, the nucleation compound comprising a first metal compound and providing nucleation points; and
   depositing a mask layer comprising a second metal compound on the seed layer by subjecting the nucleation compound to a solution comprising ions of a second metal compound, the ions being reduced in the solution using an acid in a galvanization process without an external electric field; and
   etching the substrate using the mask layer as an etch mask.

* * * * *